(12) United States Patent
Rhie

(10) Patent No.: US 9,583,496 B2
(45) Date of Patent: Feb. 28, 2017

(54) MEMORY DEVICE WITH MANUFACTURABLE CYLINDRICAL STORAGE NODE

(71) Applicant: Conversant Intellectual Property Management Inc., Ottawa (CA)

(72) Inventor: Hyoung Seub Rhie, Ottawa, CA (US)

(73) Assignee: Conversant Intellectual Property Management Inc., Ottawa (CA)

( * ) Notice: Subject to any disclaimer, the term of this patent is extended or adjusted under 35 U.S.C. 154(b) by 0 days.

(21) Appl. No.: 15/005,417

(22) Filed: Jan. 25, 2016

(65) Prior Publication Data

US 2016/0155744 A1 Jun. 2, 2016

Related U.S. Application Data

(63) Continuation of application No. 14/611,501, filed on Feb. 2, 2015, now Pat. No. 9,252,205.

(60) Provisional application No. 61/936,004, filed on Feb. 5, 2014.

(51) Int. Cl.
*H01L 27/108* (2006.01)
*H01L 49/02* (2006.01)

(52) U.S. Cl.
CPC ...... *H01L 27/10814* (2013.01); *H01L 27/108* (2013.01); *H01L 27/10817* (2013.01); *H01L 27/10855* (2013.01); *H01L 28/90* (2013.01); *H01L 28/91* (2013.01)

(58) Field of Classification Search
CPC ............. H01L 27/108; H01L 2924/143; H01L 27/1023; H01L 27/1084; H01L 27/1087; H01L 27/10855; H01L 27/10814; H01L 27/10817; H01L 28/90; H01L 28/91
USPC .... 257/68, 71, 296, 298, 300; 438/171, 210, 438/239, 244, 266
See application file for complete search history.

(56) References Cited

U.S. PATENT DOCUMENTS

| 2002/0190294 A1* | 12/2002 | Iizuka | C23C 16/405 257/296 |
| 2005/0176210 A1* | 8/2005 | Kim | H01L 28/91 438/386 |
| 2012/0273859 A1* | 11/2012 | Oyu | H01L 27/0207 257/296 |
| 2013/0161787 A1* | 6/2013 | Kim | H01L 27/0207 257/532 |

\* cited by examiner

*Primary Examiner* — Jarrett Stark
*Assistant Examiner* — Shahed Ahmed
(74) *Attorney, Agent, or Firm* — Conversant IP Management Corp.

(57) ABSTRACT

A high capacitance embedded capacitor and associated fabrication processes are disclosed for fabricating a capacitor stack in a multi-layer stack to include a first capacitor plate conductor formed with a cylinder-shaped storage node electrode formed in the multi-layer stack, a capacitor dielectric layer surrounding the cylinder-shaped storage node electrode, and a second capacitor plate conductor formed from a conductive layer in the multi-layer stack that is sandwiched between a bottom and top dielectric layer, where the cylinder-shaped storage node electrode is surrounded by and extends through the conductive layer.

18 Claims, 6 Drawing Sheets

MEMORY DEVICE WITH MANUFACTURABLE CYLINDRICAL STORAGE NODE

CROSS-REFERENCE TO RELATED APPLICATION

The present application is a continuation of application Ser. No. 14/611,501 filed Feb. 2, 2015 which in turn is claims the benefit under 35 U.S.C. §119(e) of U.S. Provisional Application No. 61/936,004, filed Feb. 5, 2014, entitled "A DRAM Memory Device with Manufacturable Capacitor." All of the aforementioned applications are incorporated herein by reference in their entireties.

FIELD OF THE INVENTION

The present invention is directed in general to integrated circuit devices and methods for manufacturing same. In one aspect, the present invention relates to a capacitor formed in a semiconductor device.

DESCRIPTION OF THE RELATED ART

Integrated circuit devices, such as dynamic random access memory (DRAM) devices, increasingly require high performance capacitors with sufficient capacitance to extend the refresh period and increase tolerance to alpha particles. For example, a typical DRAM cell configuration includes a capacitor for storing a charge (i.e., the bit of information) and an access transistor that provides access to the capacitor during read and write operations. To increase the storage node capacitance for high performance memory cells relative to bit line capacitance, the overlap area between an upper electrode (plate electrode) and a lower electrode (storage node electrode) should be increased and/or the thickness of a dielectric film interposed between the upper and lower electrodes should be reduced, for example by using a high-k dielectric material having a high dielectric constant k. And while plate overlap can be increased by forming large, overlapping lateral capacitor plate layers, such structures reduce the pattern density at the memory region, resulting in loading effects during photo lithography, etch, and polishing steps. Another technique for increasing capacitance is to fabricate the capacitor in the semiconductor substrate as a cylinder-shaped electrode plate that is concentrically positioned around a lower or storage node electrode plate to create the increased capacitance from the surface area of the storage node electrode. However, the height of such cylindrical capacitors is effectively limited by the constraints from high aspect ratio contact etch limitations which prevent contact etching from proceeding to a sufficient depth. For example, aspect ratios as high as 50-60 are now common in state-of-the-art DRAM devices. While the technical difficulties of fabricating high aspect ratio cell capacitors can be eased by using separate photolithographic steps to stack several vertical layers on top of each other to eventually form one cell capacitor, such multi-stack capacitor manufacturing presents new problems with properly aligning electrodes in the different stack levels to avoid electrical shorts or gaps, and can also damage the capacitor dielectric layers which are sequentially deposited and etched in each stack level. Another approach for increasing the storage capacitance, such as shown in U.S. Pat. No. 7,449,739, is to form embedded upper and lower capacitor stacks which each include a cylindrically shaped inner storage node and an outer electrode that wraps around a thin capacitor dielectric film formed on the inner storage node. However, the fabrication of capacitor stacks requires that, at each stack, the top of the outer electrode must be recessed below the top of the inner storage node to prevent the outer electrode and inner storage node from being electrically shorted together. To achieve such recessed plate heights, one or more control liner layers may be formed over the top of the inner storage node and then carefully etched to prevent the top of the outer electrode from being exposed. As seen from the foregoing, there continue to be challenges associated with designing and fabricating high performance capacitors.

BRIEF DESCRIPTION OF THE DRAWINGS

The present invention may be understood, and its numerous objects, features and advantages obtained, when the following detailed description is considered in conjunction with the following drawings, in which.

Figure 1:
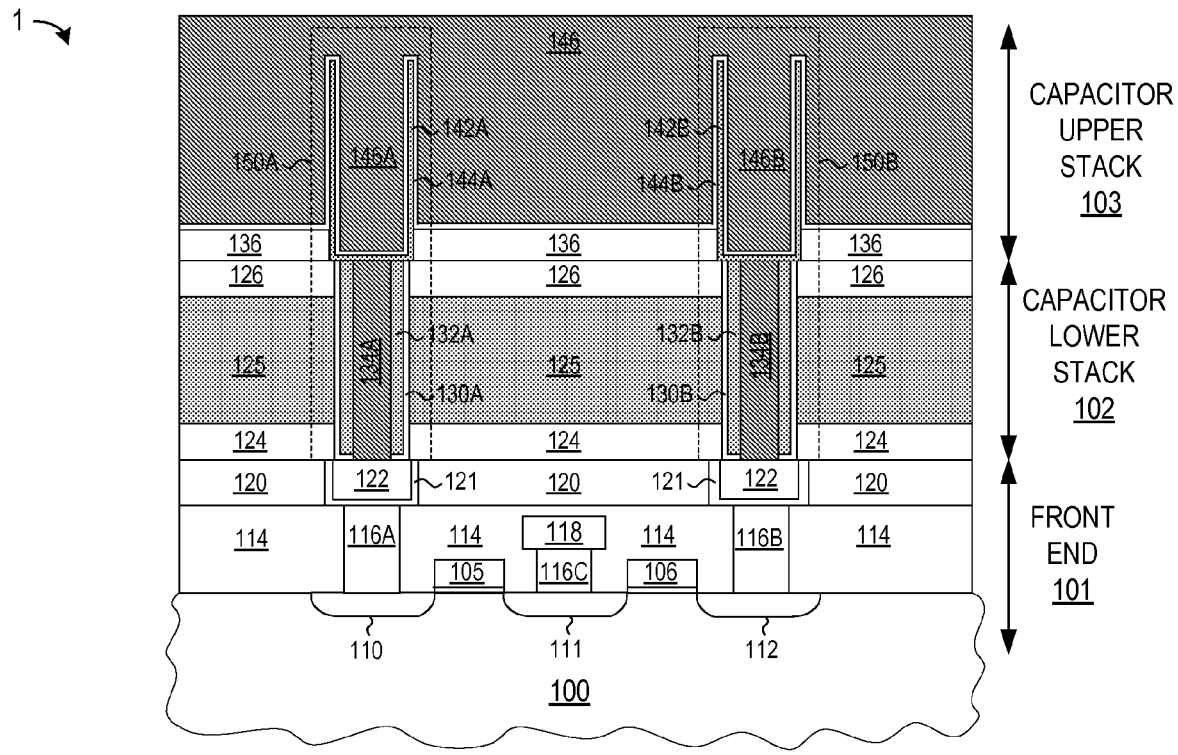
FIG. 1 illustrates a simplified cross-sectional view of a semiconductor device having two capacitors manufactured in two stacks in accordance with selected embodiments of the present disclosure.
Figure 2:
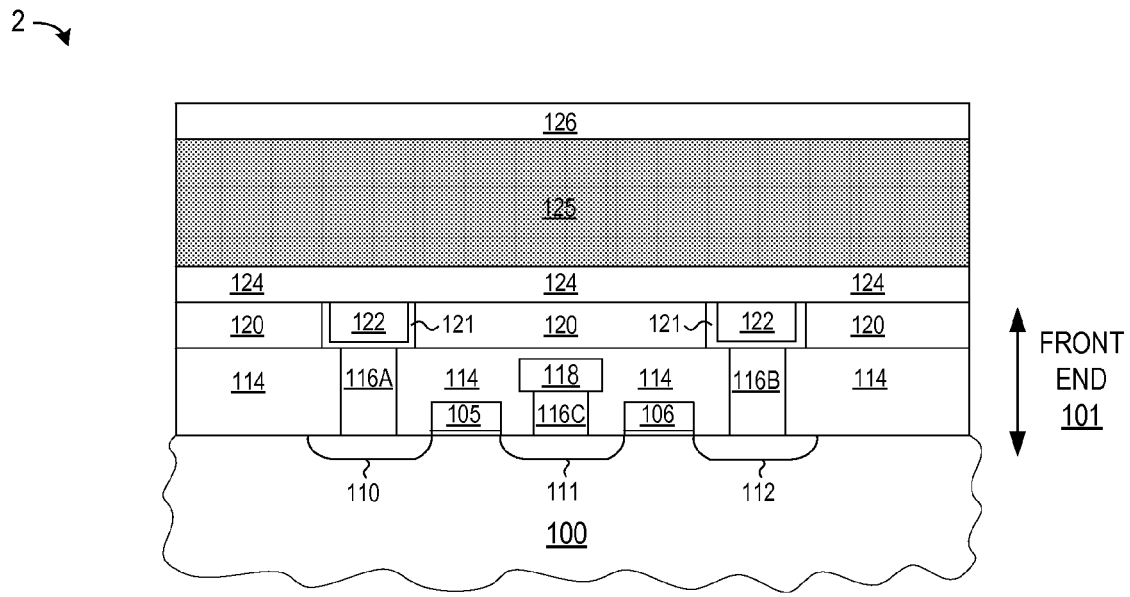
FIGS. 2-10 illustrate partial cross-sectional views of a semiconductor device during successive phases of a fabrication sequence in which one or more embedded capacitors are formed with a process tolerant capacitor stack structure to provide a high capacitance metal-insulator-metal capacitor in accordance with selected embodiments of the present disclosure.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A high capacitance embedded metal interconnect capacitor and associated fabrication processes are disclosed in which multi-stack capacitor structures are formed with one or more lower capacitor stacks which each include a first plate formed with a cylinder-shaped storage node electrode and a second plate formed with a conductive plate layer such that the cylinder-shaped storage node electrode is surrounded by and extends through a conductive plate layer. By forming the second plate with a conductive plate layer instead of a thin outer electrode layer that wraps around the cylinder-shaped storage node electrode, a robust and highly manufacturable capacitor structure is provided which protects the capacitor dielectric layer against etch-related damage, avoids the processing challenges associated with recessing the outer second plate layer relative to the inner storage node electrode, and/or reduces or eliminates electrical shorts between the first and second plates. In selected embodiments, a lower capacitor stack is formed on a front end structure with a multi-layer stack having a conductive plate layer sandwiched between top and bottom dielectric layers. After patterning a deep trench opening in the multi-layer stack to expose a buried contact layer from the front end structure, a high capacitance metal-insulator-metal capacitor may be formed by sequentially forming a high-k dielectric layer and first storage electrode layer in the deep trench opening, directionally etching the high-k dielectric layer and first storage electrode layer to form an opening which exposes the buried contact layer, and then filling the opening with a planarized conductive material to form the inner storage node electrode. Formed from the remaining first storage electrode layer and planarized conductive material, the inner storage node electrode is surrounded by the high-k dielectric layer and conductive plate layer, and includes top and bottom surfaces which extend respectively, above and below the conductive plate layer. In selected embodiments, the high capacitance MIM capacitor may include a plurality of intermediate capacitor stacks between a front end structure and top capacitor stack, where each intermediate capacitor stack is formed in a multi-layer stack which includes a first plate segment formed with a cylinder-shaped storage node electrode formed in a multi-layer stack through hole, and also includes a second plate segment formed with a conductive plate layer from the multi-layer stack such that the cylinder-shaped storage node electrode is surrounded by and extends through the conductive plate layer. In this way, the high capacitance MIM capacitor is cost-effectively fabricated as an embedded DRAM capacitor without requiring formation of an etch stop layer or controlled etch processing to recess the top of the outer electrode below the inner storage node.

In this disclosure, an improved system, apparatus, and fabrication method are described for fabricating one or more embedded metal interconnect capacitor structures in a wafer or substrate that address various problems in the art where various limitations and disadvantages of conventional solutions and technologies will become apparent to one of skill in the art after reviewing the remainder of the present application with reference to the drawings and detailed description provided herein. For example, there are challenges with increasing the capacitance of integrated circuit capacitors imposed by etch depth limitations from vertical etching high aspect ratio openings, alignment tolerances associated with thin film conductive layers, and/or etch process complexities associated with recessing thin film conductive layers. Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art how to make or use the present invention.

Turning now to FIG. 1, there is shown a simplified cross-sectional view of a semiconductor device 1 having two capacitors 150A, 150B manufactured over a substrate 100 in accordance with selected embodiments of the present disclosure. As illustrated, each capacitor 150A, 150B is formed over a front end structure 101 to include a lower stack 102 and upper stack 103. Though example structures, well and layer regions in the semiconductor device 1 are illustrated in simplified form with straight lines and curved or corner regions, it will be appreciated that the actual profile(s) for the different structures, well, and layer regions will not necessarily conform to simplified depictions, but will instead depend on the specific fabrication process(es) used. For example, the various well or source/drain regions may have a curved junction profile reflecting the implantation and heating steps used in the formation of same. In addition, the depicted device structures may be formed with different semiconductor materials having P-type conductivity and N-type conductivity. With the P-type materials, the dopant concentrations vary from lowest dopant concentrations (P−, higher dopant concentration (P), even higher dopant concentration (P+), and the highest dopant concentration (P++). Similarly, the dopant concentrations for the N-type materials vary from lowest dopant concentrations (N), higher dopant concentration (N+), and the highest dopant concentration (N++).

In the semiconductor device 1, the depicted substrate 100 may be formed as a bulk semiconductor substrate, semiconductor-on-insulator (SOI) type substrate or other semiconductor substrate material in which one or more additional semiconductor layers and/or well regions are formed using epitaxial semiconductor growth and/or selective doping techniques as described more fully hereinbelow. In an upper portion of the substrate 100, one or more shallow trench isolation (STI) structures (not shown) may be formed that divide the substrate 100 into separate regions to provide isolated active circuit regions. The upper portions of substrate 100 may also include one or more active substrate wells or layers (not shown) between the STI regions that are formed by selectively implanting or diffusing appropriate polarity impurities into the substrate 100. As will be appreciated, the dopant type used to form the active well regions will depend on whether the transistors formed in each area are n-type or p-type devices. If desired, one or more additional deep well regions (not shown) may be formed to isolate the active well regions, such as by selectively implanting or diffusing appropriate polarity impurities.

Without belaboring the details, one or more active circuits or transistor devices are formed in the different regions of the substrate 100 and encapsulated with one or more inter-layer dielectric (ILD) layers 114. For example, the active circuits or transistor devices may be formed using any desired sequence of fabrication steps to define one or more patterned gate electrodes with sidewall implant spacers and one or more source/drain regions, and may include one or more defined electrically conductive contact structures 116 for electrically connecting the source/drain regions and/or gate electrodes to power or signal lines. For example, the active circuits may include one or more transistor devices formed with a gate electrode stack 105, 106 and self-aligned source/drain regions 110-112 which are illustrated in simplified schematic form. In other embodiments, the transistor devices can be made with any desired technology, such as MOSFET transistors, PINFET transistors, FINFET transistors, or the like, and may include different designs, such as buried bit lines, high-k metal gate electrodes, etc. Each transistor may be connected to corresponding embedded capacitors to form an embedded DRAM circuit, with a first access transistor formed with gate electrode stack 105 and source/drain regions 110, 111, and with a second access transistor formed with gate electrode stack 106 and source/drain regions 111, 112. To connect the transistor devices to a power or signal conductor, one or more contact structures 116, bit line conductors 118, and buried contacts (which may be formed with one or more barrier metal liner layers 121 and first metal (M1) interconnect lines 122) are formed in one or more patterned inter-layer dielectric (ILD) layers 114, 120 using a dual damascene process to electrically connect to the source/drain regions 110-112 formed in the substrate 100. For example, the front end structure 101 may include a bottom planarized ILD layer 114 formed with a suitable dielectric material (e.g., SiO2, SiOC, SiOF, doped or undoped tetra-ethyl ortho-silicate (BPTEOS), or other low-k dielectric materials) by patterning and etching a first planarized dielectric layer 114 to form via openings over the source/drain regions 110, 112 which are filled by depositing and polishing a metal layer (e.g., copper) to form the contact structures 116. In addition, an opening in the first planarized dielectric layer 114 may be formed to remove part of the contact structure 116 over the shared source/drain region 111, filled with a conductive layer 118, and then covered with additional dielectric layer to form the common bit line conductor 118. Subsequently, a covering ILD layer 120 is formed on the bottom ILD layer 114 by patterning and etching a second planarized dielectric layer 120 to form trench openings over the contact structures 116 which are conformally coated with one or more relatively thin barrier metal layers 121 (e.g., Ta, TaN, Ta/TaN, Ta/TiN, WN) and then filled by depositing and polishing a metal layer 122 (e.g., copper, tungsten, or aluminum) with a chemical mechanical polish (CMP) process to form the first metal (M1) interconnect lines. At this point, an etch stop layer (e.g., SiN, SiC, SiCN, SiON, SiCON, or the like) may be deposited on the entire surface of the semiconductor device 1 to serve as a base for forming the next interconnect level.

In the upper interconnect level(s), multiple capacitor stacks are formed to define one or more capacitor structures. For example, the depicted semiconductor device 1 includes two DRAM cells, each including a cell capacitor and a cell transistor which are connected in series between a common conductive structure 146 (the "plate") and a common bit line 118. The two cell transistors are formed by two gates 105, 106 which run as word lines, and one common bit line 118 which is connected to a first, common source/drain 111 of each of the two cell transistors through a central contact via 116C. The two cells have two separate storage nodes. The storage node of each cell encompasses a source/drain region 110, 112, a buried contact 116A/B, an optional buried contact pad 121-122, and a first plate electrode formed with a cylinder-shaped storage node electrode 132A/B, 134A/B in the capacitor lower stack 102 and a lower electrode formed with thin conductive extension structures 142A/B in the capacitor upper stack 103. As will be appreciated, the conductive extension structures 142A/B may have any desired shape, such as an extension finger or cylindrical shell structures which form an extended conductive surface for the lower electrode storage formed in the capacitor upper stack. Each cell also includes a common second plate electrode formed with a conductive plate layer 125 in the capacitor lower stack 102 and a common plate electrode 146 formed in the capacitor upper stack 103. In selected embodiments, the common plate electrode 146 is formed with upper electrodes 146A/B formed inside the thin conductive extension structures 142A/B and electrically connected together, while in other embodiments, the common plate electrode 146 is formed with a deposited upper electrode layer 146 which is formed to surround the thin conductive extension structures 142A/B on both sides to increase the capacitance for each cell.

Although not explicitly shown, it will be understood that the common plate electrode 146 and conductive plate layer 125 may be directly connected to form a common electrical node, for example by forming a connection using conductive contact via and plug structures outside of the cell array. It will also be understood that the depicted conductive elements are embedded in one or more interlevel dielectric layers, such as silicon oxide or the like. Also, the depicted vertical structures are shown in simplified form without showing multilayer structures or the exact vertical structure of the cell transistors. For example, it is well known in the art that various techniques are applied to minimize the off-state leakage currents of cell transistors, for example by giving the transistors a three-dimensional structure with recessed channels, thereby increasing the channel lengths without increasing the cell layout size.

To enable the fabrication of high aspect ratio cell capacitors with minimal processing complexity and risk of intra-plate shorts, the lower capacitor stack 102 is formed with a three-layer structure having a bottom dielectric layer 124, a middle conducting layer 125, and a top dielectric layer 126. In one or more through hole contact openings formed to penetrate the three-layer structure 124-126, a conformal capacitor dielectric film 130A/B is formed to cover part of the bottom and the sidewall surfaces of the through hole contact opening(s). On the dielectric film 130A/B, a cylinder-shaped storage node electrode is formed to extend through the lower capacitor stack 102. In selected embodiments, the cylinder-shaped storage node electrode is formed by first forming a conformal conductive layer 132A/B to completely cover the conformal capacitor dielectric film 130A/B and then removing the conformal conductive layer 132A/B from the bottom of the holes 133A/B to expose the buried contact pads 121-122 at the bottom of the through hole contact opening(s). In addition, a second conductive layer 134A/B is formed to cover the sidewalls of the conformal conductive layer 132A/B to fill the remainder of the holes 133A/B while remaining isolated from the middle conducting layer 125 by the remaining sidewall and bottom parts of the conformal capacitor dielectric film 130A/B, thereby forming a conductive path connecting the top and bottom of the through hole contact opening(s). As will be appreciated, the upper surface of the dielectric film 130A/B, first conformal conductive layer 132A/B, and second conductive layer 134A/B described may have a circular or elliptical shape when formed in a circular through hole contact opening.

To illustrate the formation of the upper capacitor stacks 102, 103 over the front end structure 101, reference is now made to FIGS. 2-10 which illustrate partial cross-sectional views of the semiconductor device 1 shown in FIG. 1 during successive phases of a fabrication sequence in which one or more embedded capacitors are formed with a process tolerant capacitor stack structure to provide a high capacitance metal-insulator-metal capacitor in accordance with selected embodiments of the present disclosure. Starting first with FIG. 2, there is shown a partial cross section view 2 of a multi-layer stack 124-126 formed over the front end structure 101 described hereinabove. As depicted, the multi-layer stack is formed with a conductive layer 125 that is sandwiched between isolating dielectric layers 124, 126. The bottom dielectric or insulating layer 124 may be formed by depositing a continuous dielectric film, such as silicon dioxide or silicon nitride, on top of the front end structure 101, to a predetermined thickness using any desired deposition technique, such as chemical vapor deposition (CVD), plasma-enhanced chemical vapor deposition (PECVD), physical vapor deposition (PVD), atomic layer deposition (ALD), molecular beam deposition (MBD), or any combination of the above. On the bottom dielectric layer 124, a conductive layer 125 may be formed using any desired deposition technique to form a conductive material (e.g., doped polysilicon or silicide) to a target thickness, followed in sequence by the deposition of a second dielectric or insulating layer 126 on top of the conductive layer 125. The second dielectric or insulating layer 126 may be formed by depositing or growing a continuous dielectric film, such as silicon dioxide or silicon nitride. The heights or thicknesses of the dielectric or insulating layers 124, 126 may be, for example, a few hundred Angstroms, whereas the height or thickness of the conductive layer 125 may be for example 10,000 Angstroms.

Figure 3:
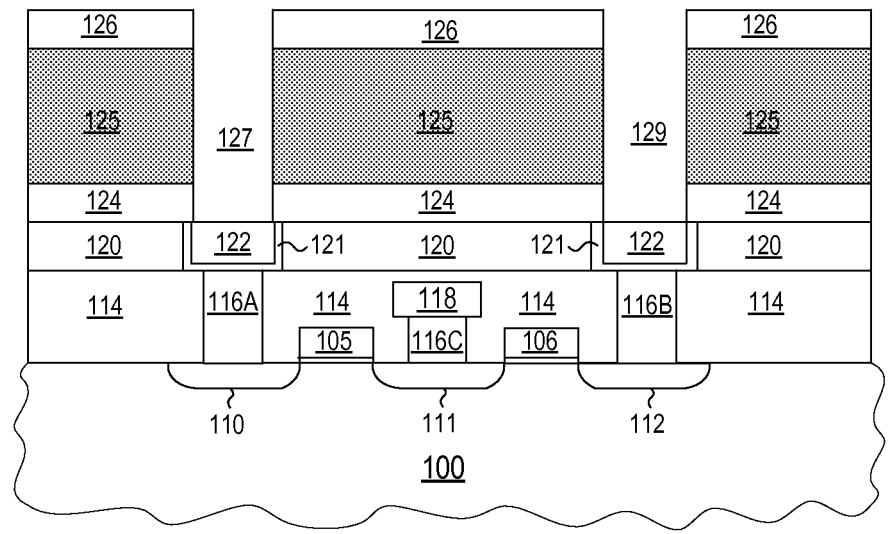

Turning now to FIG. 3, there is shown a partial cross section view of the semiconductor device 3 after the multi-layer stack 124-126 is patterned and etched to form through hole openings 127, 129 to expose buried contacts 121-122 in the front end structure 101. As will be appreciated, the through hole openings 127, 129 may be formed using any desired technique, such as selectively etching openings 127, 129 in the multi-layer stack 124-126 using a patterned mask or photoresist layer (not shown) and applying one or more anisotropic etch processes, such as an RIE etch, to define patterned openings 127, 129. Examples of such selective etch processes include, but are not limited to, using a wet or dry etch chemistry, ablation, or any combination thereof. In selected embodiments, the etch process is controlled to be selective to all the materials used to form the front end structure 101, such as, for example, interconnect barrier materials (e.g., tantalum), etch stop materials (e.g., silicon nitride), and interlayer dielectric materials (e.g., silicon dioxide) so that such materials remain substantially intact. As a result of the etch process(es), the vertically stacked layers include a conductive plate layer 125 surrounding the openings 127, 129 which are isolated from above and below by the ILD layers 124, 126. As will be appreciated, the through hole openings 127, 129 may be formed by etching cylindrical or elliptical holes through the entire multi-layer stack 124-126 to expose the buried contact pads 121-122, though in other embodiments, the etch process(es) may leave a portion of the bottom dielectric layer 124 in place.

Figure 4:
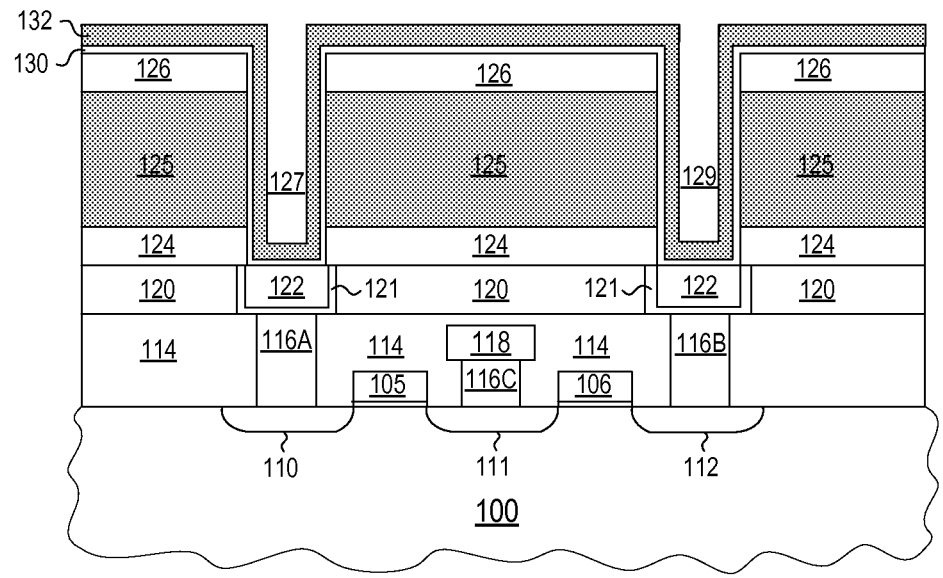

Turning now to FIG. 4, there is shown a partial cross section view of the semiconductor device 4 after a conformal capacitor dielectric layer 130 and first conductive plate layer 132 are sequentially formed in the through hole opening(s) 127, 129. As an initial step, the conformal capacitor dielectric layer 130 may be deposited as a conformal insulating layer using any desired deposition technique, such as CVD, PECVD, PVD, ALD, MBD, or any combination(s) of the above to form a thin continuous capacitor dielectric layer 130 covering over all of the structures fabricated in previous steps. As formed, the conformal capacitor dielectric layer 130 covers at least the bottom and sidewall surfaces of the through hole opening(s) 127, 129. A suitable dielectric material for the capacitor dielectric layer 130 is silicon oxide or silicon nitride, or a high-k dielectric such as aluminum oxide, tantalum oxide, zirconium oxide, hafnium oxide, or other insulator material having a dielectric constant value k of 7.0 or greater, including a hafnium-based dielectric such hafnium silicate (e.g., $Hf_xSi_{1-x}O_y$) or hafnium oxy-nitride (e.g., $Hf_xSi_{1-x}O_yN_z$), though other silicates of zirconium, aluminum, lanthanum, strontium, tantalum, titanium and combinations thereof may also be used, including but not limited to $HfSiO_X$, $ZrSiO_X$, $LaSiO_X$, $YSiO_X$, $ScSiO_X$, $CeSiO_X$, and $HfLaSiO_X$. On the capacitor dielectric layer 130, a first conductive plate layer 132 may be formed by conformally depositing one or more suitable conductor materials (e.g., n-doped polysilicon, TiN, TaN) using CVD, PECVD, ALD, MBD, or any combination(s) thereof to a predetermined thickness in the range of 5-200 Angstroms (e.g., 20-50 Angstroms), though other materials and thicknesses may be used. Though not shown, the first conductive plate layer 132 may also include one or more barrier layers, such as sputtered or ALD barrier metal layers, such as Ta, TaN, Ta/TaN, Ta/TiN, or WN. As illustrated, the conformal capacitor dielectric layer 130 electrically separates the first conductive plate layer 132 from the conductive layer 125.

Figure 5:
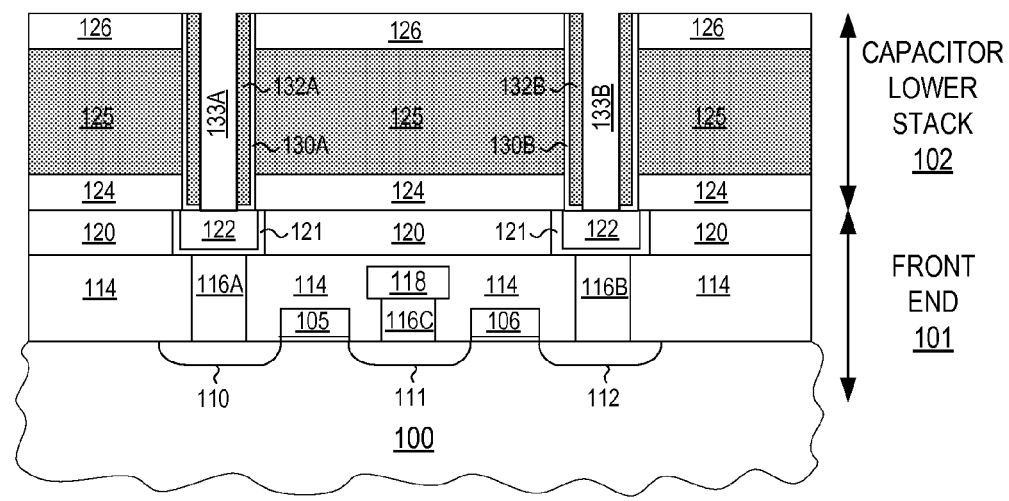

Turning now to FIG. 5, there is shown a partial cross section view of the semiconductor device 5 after a directional etch exposes the buried contact pads 121-122 while retaining the capacitor dielectric layer 130 and first conductive plate layer 132 on the sidewalls of the etch openings 133A/B. While any etch process may be used, in selected embodiments, a directional or anisotropic etch, such as an RIE etch, may be applied to selectively remove the capacitor dielectric layer 130 and first conductive plate layer 132 from the top surface of the top dielectric layer 126 and from the bottom of the etch openings 133A/B, thereby forming remnant sidewall conductive plate layers 132A/B which are electrically isolated into separate nodes and confined within the individual holes 133A/B. The directional etch process may be supplemented by a subsequent isotropic (e.g., wet) etch process to ensure that any residues are removed. As a result of the directional etch process(es), the buried contact pads 121-122 at the bottom of the holes 133A/B are exposed by the etch openings 133A/B, but the capacitor dielectric layer portions 130A/B at the sidewalls are not exposed. Though drawn for simplicity as having uniform sidewall thickness, it will be appreciated that remnant sidewall conductive plate layers 132A/B may not have a uniform thickness when the direction etch results in the top region of the conductive plate layers 132A/B having thinner film thickness than the bottom region.

Figure 6:
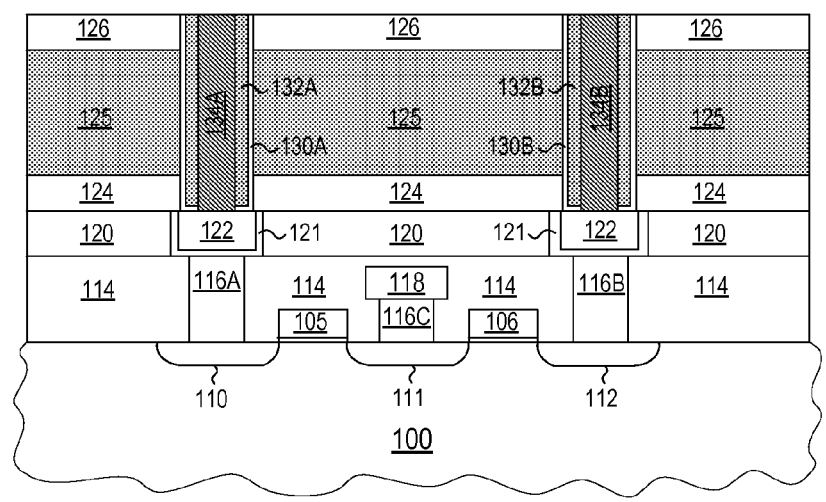
Figure 7:
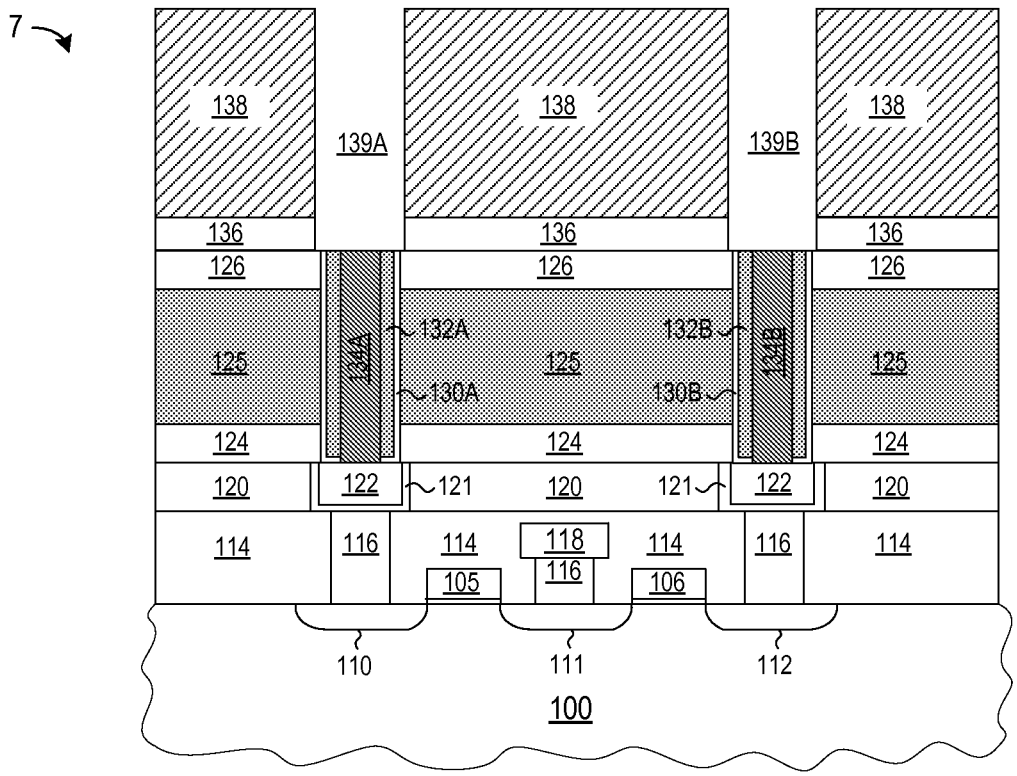

Turning now to FIG. 6, there is shown a partial cross section view of the semiconductor device 6 after the etch openings are filled with one or more conductive layers 134A/B. In selected embodiments, one or more layers of conductive metal material may be deposited and planarized to fill the etch openings 133A/B, such as by forming one or more layers of suitable conductive material (e.g., polysilicon, Ti, TiN, W, copper) using CVD, PECVD, sputtering, PVD, electro-plating, electro-less plating, or the like, followed by chemical mechanical polish (CMP) planarization to remove the copper and any remaining layers from the top dielectric layer 126. At this point, the capacitor lower stack 102 is completed, though a covering etch stop layer (not shown) may be formed on the entire surface of the semiconductor device 6.

On the capacitor lower stack 102, one or more upper stacks may be formed to complete the capacitors. To illustrate an example fabrication sequence, reference is now made to FIG. 7 which shows a partial cross section view 7 of a patterned dielectric stack 136, 138 formed over the capacitor lower stack 102 described hereinabove. While any desired fabrication process may be used, in selected embodiments, the patterned dielectric stack 136, 138 may be formed by sequentially depositing first and second dielectric layers 136, 138 using any desired deposition technique, such as CVD, PECVD, PVD, ALD, MBD, or any combination(s) of the above to a predetermined thickness. For example, the first dielectric layer 136 may be deposited with a dielectric material (e.g., silicon oxide) that is different from the underlying dielectric layer 126, while the second dielectric layer 138 may be deposited as a sacrificial layer using a dielectric material (e.g., silicon nitride) that is different from the underlying dielectric layer 136. In addition, the deposited first dielectric layer 136 is selected to have an etch rate that is slower than the etch rate of the underlying dielectric layer 126, thereby providing an etch stop layer function. In the first and second dielectric layers 136, 138, one or more via or trench openings 139A/B are formed, for example by using a patterned photoresist layer or etch mask (not shown) to directionally or anisotropic ally etch portions of the first and second dielectric layers 136, 138 to form the etch openings 139A/B. Examples of such etch processes include, but are not limited to, using a wet or dry etch chemistry, ablation, or any combination thereof. In selected embodiments, the etch process is controlled to be selective to all the materials used to form the lower capacitor stack 102, such as, for example, the conductive layers 132A/B, 134A/B, the etch stop materials (e.g., silicon nitride), the high-k capacitor dielectric layer 130A/B, and the underlying dielectric 126 (e.g., silicon dioxide) so that such materials remain substantially intact. Through proper patterning and placement, the etch openings 139A/B are located where the upper capacitor stacks are to be formed.

Figure 8:
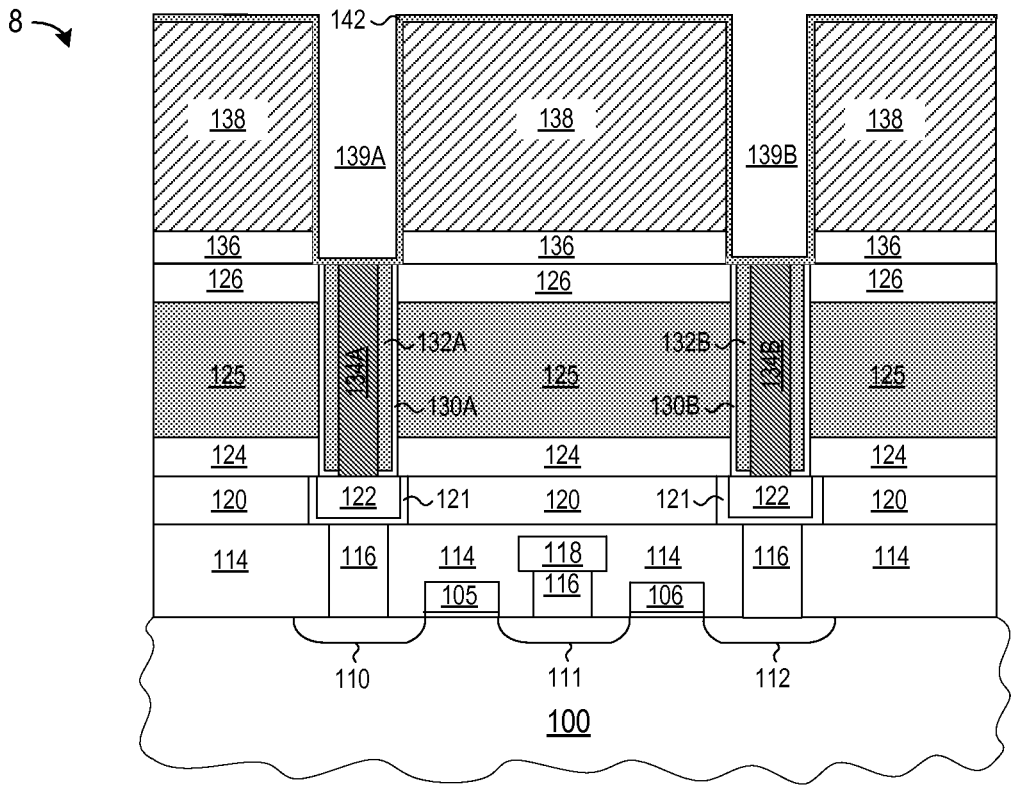

Turning now to FIG. 8, there is shown a partial cross section view of the semiconductor device 8 after a bottom conductive electrode layer 142 is formed on the bottom and sidewall surfaces of the etch openings 139A/B. In selected embodiments, the bottom conductive electrode layer 142 may be formed by conformally depositing one or more suitable conductor materials (e.g., n-doped polysilicon, TiN, TaN) using CVD, PECVD, ALD, MBD, or any combination(s) thereof to a predetermined thickness in the range of 5-200 Angstroms (e.g., 20-50 Angstroms), though other materials and thicknesses may be used. Though not shown, the bottom conductive electrode layer 142 may also include one or more barrier layers, such as sputtered or ALD barrier metal layers, such as Ta, TaN, Ta/TaN, Ta/TiN, or WN. As illustrated, the bottom conductive electrode layer 142 covers the top and exposed sidewalls of the patterned dielectric stack 136, 138 so as to be directly electrically connected to a cylinder-shaped storage node electrode 132A/B, 134A/B in the capacitor lower stack 102 as part of the first plate electrode. In addition, the bottom conductive electrode layer 142 is electrically isolated from the conductive layer 125 in the capacitor lower stack 101.

Figure 9:
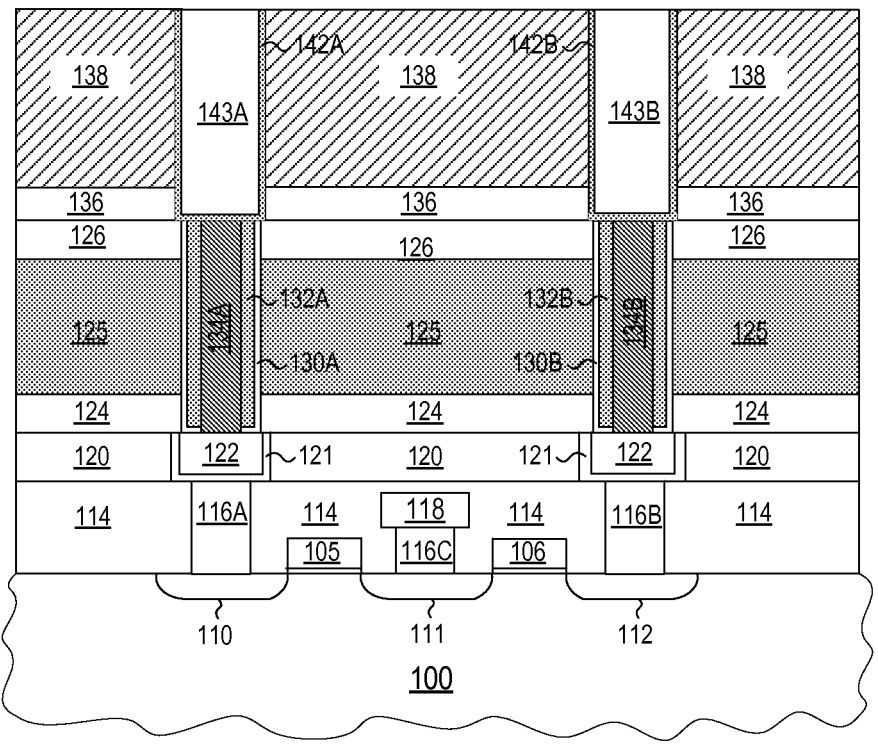

Turning now to FIG. 9, there is shown a partial cross section view of the semiconductor device 9 after a polish or other selective recess etch is applied to remove the bottom conductive electrode layer 142 from the top of the patterned dielectric stack 136, 138. As a preliminary step, the etch openings 139A/B are filled with protective film 143A/B as a sacrificial oxide mold layer, such as silicon oxide, in order to protect the bottom conductive electrode layer 142 in the inside of openings 139A/B. Subsequently, a chemical mechanical polish (CMP) planarization and/or dry etch step may be applied to remove the bottom conductive electrode layer 142 from the top of the sacrificial dielectric layer 138, leaving only the thin conductive extension structures 142A/B on the sidewalls of the etch openings 139A/B. As a result of the polish/etch process(es), the thin conductive extension structures 142A/B formed in the etch openings 139A/B are separate, electrically isolated nodes confined within the individual holes 139A/B.

Figure 10:
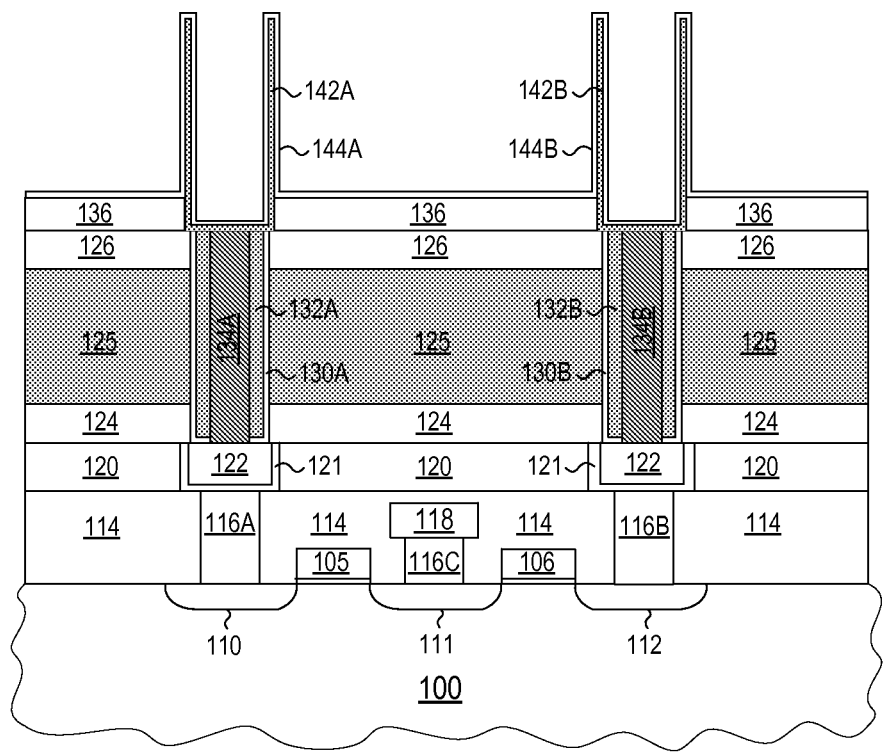

Turning now to FIG. 10, there is shown a partial cross section view of the semiconductor device 10 after the sacrificial dielectric layer 138 is removed and a conformal capacitor dielectric layer 144A/B is formed over the thin conductive extension structures 142A/B. For example, a selective etch or wet etch process, such as hydrofluoric acid (HF), may be applied to remove the sacrificial dielectric layer 138 and protective film 143A/B while leaving substantially intact the conductive extension structures 142A/B and underlying first dielectric layer 136. On the thin conductive extension structures 142A/B, a suitable dielectric layer 142A/B may be selectively grown or deposited as a conformal layer, such as by using thermal oxidation, CVD, PECVD, ALD, MBD, or any combination(s) thereof to deposit a high-k dielectric layer 144A/B. A suitable high-k dielectric material is an insulator material having a dielectric constant value k of 7.0 or greater, including a hafnium-based dielectric such hafnium silicate (e.g., $Hf_xSi_{1-x}O_y$) or hafnium oxy-nitride (e.g., $Hf_xSi_{1-x}O_yN_z$), though other silicates of zirconium, aluminum, lanthanum, strontium, tantalum, titanium and combinations thereof may also be used, including but not limited to $HfSiO_X$, $ZrSiO_X$, $LaSiO_X$, $YSiO_X$, $ScSiO_X$, $CeSiO_X$, and $HfLaSiO_X$. As illustrated, the conformal capacitor dielectric layer 142 is formed on both sides of the thin conductive extension structures 142A/B. Subsequently, a common plate electrode 146 may be formed by planarizing one or more layers of suitable conductor materials (e.g., TiN, TaN) using CVD, PECVD, sputtering, PVD, electro-plating, electro-less plating, or the like. The resulting capacitor structure completed in the capacitor upper stack 103 is illustrated in FIG. 1. As illustrated, the resulting capacitor structure includes a first plate electrode storage node formed with a cylinder-shaped storage node electrode 132A/B, 134A/B in the capacitor lower stack 102 and a lower electrode formed with thin conductive extension structures 142A/B in the capacitor upper stack 103, and also includes a common second plate electrode formed with the conductive plate layer 125 in the capacitor lower stack 102 and a common plate electrode 146 formed in the capacitor upper stack 103.

Figure 11:
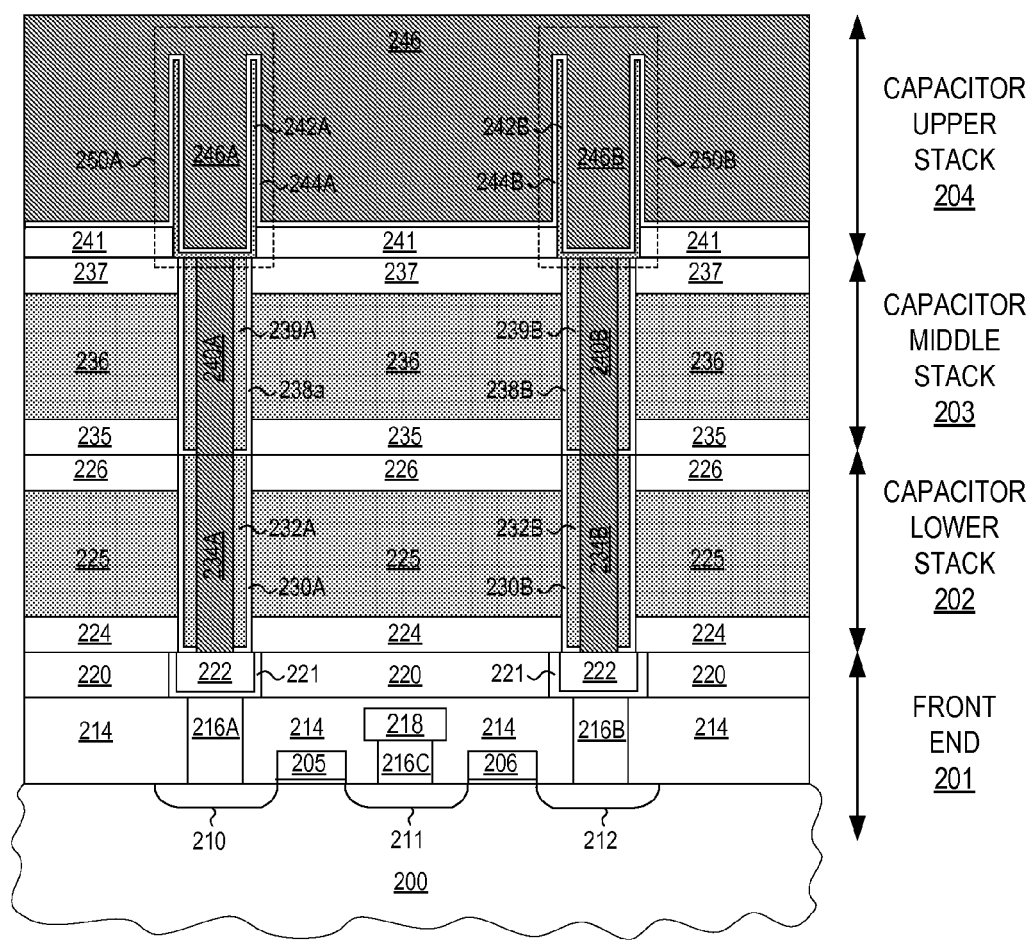
FIG. 11 illustrates a simplified cross-sectional view of a semiconductor device having capacitors manufactured in multiple stacks in accordance with selected embodiments of the present disclosure.

To provide high performance MIM capacitors with increased capacitance, the semiconductor devices, such as DRAM cells described herein, may be formed with a plurality of intermediate capacitor stacks between a front end structure and top capacitor stack. For example, reference is now made to FIG. 11 which illustrates a simplified cross-sectional view of a semiconductor device 11 having capacitors manufactured in multiple stacks 201-204 in accordance with selected embodiments of the present disclosure. As illustrated, each DRAM capacitor may be formed with three or more capacitor stacks 202-204 formed over the front end structure 201, so there is no limit to any specific number of stacks. Using the methodology described hereinabove for forming the lower capacitor stack 102, each of the intermediate capacitor stacks 202-203 may be formed before the upper capacitor stack 204 is formed.

Without belaboring the details, the front end structure 201 includes one or more active circuits or transistor devices formed in substrate 200 with gate electrode stacks 205, 206 and self-aligned source/drain regions 210-212 that are encapsulated with one or more inter-level dielectric layers 214 in which one or more defined electrically conductive contact structures 216 are formed for electrically connecting the source/drain regions and/or gate electrodes to buried contact structures 214 or shared bit line conductors 218. On the front end structure 201, a first intermediate capacitor stack 202 is formed in a multi-layer stack 224-226 which includes a conductive plate layer 225 sandwiched between top and bottom dielectric layers 224, 226. In the multi-layer stack 224-226, one or more through holes are etched. On the sidewalls of each through hole, a conformal capacitor dielectric layer 230A/B is formed, followed by formation of a conformal conductive layer 232A/B on the conformal capacitor dielectric layer 230A/B. Lastly, the through hole is filled with one or more conductive materials to form a cylinder-shaped storage node electrode 234A/B which is surrounded by, but electrically isolated from, the conductive plate layer 225 so that the cylinder-shaped storage node electrode 234A/B extends above and below the conductive plate layer 225.

On the first intermediate capacitor stack 202, a second intermediate capacitor stack 203 is formed in a multi-layer stack 235-237 which includes a conductive plate layer 236 sandwiched between top and bottom dielectric layers 235, 237. In the multi-layer stack 235-237, one or more through holes are etched, and the sidewalls of each through hole are conformally coated with conformal capacitor dielectric layer 238A/B, followed by formation of a conformal conductive layer 239A/B. Lastly, the through hole in the multi-layer stack 235-237 is filled with one or more conductive materials to form a cylinder-shaped storage node electrode 240A/B which is surrounded by, but electrically isolated from, the conductive plate layer 236 so that the cylinder-shaped storage node electrode 240A/B extends above and below the conductive plate layer 236.

On the second intermediate capacitor stack 203, an upper capacitor stack 204 is formed using the methodology described hereinabove for forming the upper capacitor stack 103. For example, the upper capacitor stack 204 may include a patterned bottom dielectric layer 241, thin conductive extension structures 242A/B which are formed on sidewalls of a sacrificial dielectric layer (not shown) and electrically connected, respectively, to the cylinder-shaped storage node electrode 240A/B from the second intermediate capacitor stack 203. In addition, the upper capacitor stack 204 includes a high-k dielectric layer 244A/B formed to conformally cover the thin conductive extension structures 242A/B, and a common plate electrode 246 formed in the capacitor upper stack 204. In selected embodiments, the common plate electrode 246 is formed with upper electrodes 246A/B formed inside the thin conductive extension structures 242A/B and electrically connected together, while in other embodiments, the common plate electrode 246 is formed with a deposited upper electrode layer 246 which is formed to surround the thin conductive extension structures 242A/B on both sides to increase the capacitance for each cell.

In the depicted semiconductor device 11, each high capacitance MIM capacitor includes a pair of intermediate capacitor stacks 202, 203 between a front end structure 201 and top capacitor stack 204. Each intermediate capacitor stack (e.g., 202) is formed in a multi-layer stack 225-227 which includes a first plate segment formed with a cylinder-shaped storage node electrode 232A/B, 234A/B that is formed to fill a through hole in the multi-layer stack 225-227, and which also includes a second plate segment formed with a conductive plate layer 225 from multi-layer stack 225-227 such that the cylinder-shaped storage node electrode 232A/B, 234A/B is surrounded by and extends through the conductive plate layer 225 while also being electrically isolated therefrom by the capacitor dielectric layer 230A/B and protective dielectric layers 224, 226. In this way, the high capacitance MIM capacitor is cost-effectively fabricated as an embedded DRAM capacitor without requiring formation of an etch stop layer or controlled etch processing to recess the top of the outer electrode below the inner storage node.

As will be appreciated, any number of additional backend or finishing processes can be used to complete the semiconductor device, such forming any necessary metal contacts, additional inter-layer dielectric layers, planarization, passivation, addition of subsequent layers or stacks, etc.

By using the capacitor stack formation process disclosed herein, an embedded capacitor may be formed that protects the capacitor dielectric layer from etch damage or other processing defects since any dielectric etch processing does not affect the capacitor dielectric layer that is positioned between the cylinder-shaped storage node electrode (e.g., 232A, 234A) and surrounding conductive plate layer (e.g., 225). This is ensured by protecting the portions of the capacitor dielectric layers 230A/B that face the conductive plate layer 225 with a protective conductor layer 232A/B during the etch process. The disclosed capacitor stack formation process also helps avoid electrical shorting between the upper and lower electrodes, thereby allowing process margins to be increased. In particular, the placement of the conductive plate layer 225 to be sandwiched between protective dielectric layers 224, 226 prevents the conductive plate layer 225 from inadvertently contacting the thin conductive extension structures 142A/B in the capacitor upper stack 103. As a result, persons skilled in the art will appreciate that the present disclosure prevents electrical shorting by a wide process margin using readily controllable techniques, such as film deposition thickness, etch stopping at boundaries between different dielectric materials, etc.

By now it should be appreciated that there is provided herein an integrated circuit device and associated fabrication process. The disclosed integrated circuit device includes a semiconductor substrate (e.g., SOI or bulk silicon) having one or more active circuits (e.g., embedded DRAM circuit) and at least a first conductive contact structure. The integrated circuit device also includes a multi-stack capacitor structure formed over the semiconductor substrate. In the multi-stack capacitor, a first lower capacitor stack is formed in a multi-layer stack with a first capacitor plate conductor formed with a cylinder-shaped storage node electrode formed in the multi-layer stack, a capacitor dielectric layer surrounding the cylinder-shaped storage node electrode, and a second capacitor plate conductor formed from a conductive layer in the multi-layer stack that is sandwiched between a bottom and top dielectric layer, where the cylinder-shaped storage node electrode is surrounded by and extends through the conductive layer. In selected embodiments, the first capacitor plate conductor formed with the cylinder-shaped storage node is directly electrically connected to the first conductive contact structure to form a storage node for an embedded dynamic random access memory cell. In other embodiments, the cylinder-shaped storage node electrode formed in the multi-layer stack may include a first protective conductive layer formed on an interior sidewall surface of the capacitor dielectric layer and a second conductive layer formed to fill in between the first protective conductive layer. The multi-stack capacitor structure may also include a top capacitor stack formed on the first lower capacitor stack, where the top capacitor stack includes a first capacitor plate conductor formed with one or more thin conductive extension fingers and surrounded by a conformal capacitor dielectric layer, and a second capacitor plate conductor formed with one or more conductive layers that surround the first capacitor plate conductor and conformal capacitor dielectric layer. In addition or in the alternative, the multi-stack capacitor structure may include a second capacitor stack formed in a second multi-layer stack on the first lower capacitor stack. The second capacitor stack may include a third capacitor plate conductor formed with a second cylinder-shaped storage node electrode formed in the second multi-layer stack and directly electrically connected to the first capacitor plate conductor; a second capacitor dielectric layer surrounding the second cylinder-shaped storage node electrode; and a fourth capacitor plate conductor formed from a second conductive layer in the second multi-layer stack that is sandwiched between a bottom and top dielectric layer and directly electrically connected to the second capacitor plate conductor, where the second cylinder-shaped storage node electrode is surrounded by and extends through the second conductive layer. The integrated circuit device may also include a contact pad formed below the first lower capacitor stack that is in ohmic contact with the cylinder-shaped storage node and that is isolated from the conductive layer by at least a portion of the capacitor dielectric layer. In such multi-stack capacitor structures, the conductive layer may be sandwiched between a bottom dielectric layer and a top dielectric layer formed as an etch stop layer to protect the conductive layer of the second capacitor plate conductor from being exposed during an etch process, and may include a second dielectric layer formed on the top dielectric layer with a different material than the top dielectric layer, where the cylinder-shaped storage node electrode extends through the top dielectric layer to protrude above the conductive layer, but does not extend through the second dielectric layer.

In another form, there is provided a semiconductor device and associated method of fabrication. In the disclosed methodology, one or more active circuits are formed in a semiconductor substrate that are connected to at least a first conductive contact structure formed in a planarized dielectric layer. In addition, a multi-layer stack is formed on the planarized dielectric layer which includes a conductive layer that is sandwiched between a bottom dielectric layer and a top dielectric etch stop layer to form a first capacitor plate conductor. In selected embodiments, the multi-layer stack is formed by depositing a layer of silicon oxide as the bottom dielectric layer on the planarized dielectric layer, depositing a doped polysilicon or silicide layer as the conductive layer on the layer of silicon oxide, and depositing a layer of silicon nitride as the top dielectric etch stop layer on the conductive layer. A first opening is selectively etched in the multi-layer stack to expose the first conductive contact structure. To selectively etch the first opening in the multi-layer stack, a patterned etch mask may be formed over the multi-layer stack to define an etch opening over the first conductive contact structure, and one or more anisotropic etch processes are applied with the patterned etch mask in place to selectively remove portions of the multi-layer stack under the etch opening, thereby forming the first opening in the multi-layer stack having substantially vertical sidewall surfaces. In the first opening, a capacitor dielectric layer is formed to conformally coat the bottom and sidewall surfaces of the first opening. In selected embodiments, the capacitor dielectric layer may be formed by depositing as a conformal layer of silicon oxide, silicon nitride, or a high-k dielectric material to form a thin continuous capacitor dielectric layer covering the bottom and sidewall surfaces of the first opening. In addition, a cylinder-shaped second capacitor plate conductor is formed on the capacitor dielectric layer to fill the first opening. To form the cylinder-shaped second capacitor plate conductor, a first conformal conductive plate layer may be deposited on the capacitor dielectric layer formed on the bottom and sidewall surfaces of the first opening, followed by application of one or more anisotropic etch processes to remove portions of the first conformal conductive plate layer and the capacitor dielectric layer from the bottom of the first opening and from the top dielectric etch stop layer, thereby exposing the first conductive contact structure. Subsequently, a second conductive plate layer may be deposited to fill the first opening and form the cylinder-shaped second capacitor plate conductor in ohmic contact with the first conductive contact structure, and one or more etch or polish steps may be applied to planarize the second conductive plate layer until substantially coplanar with an upper surface of the top dielectric etch stop layer. As formed, the cylinder-shaped second capacitor plate conductor and capacitor dielectric layer are surrounded by and extend above the conductive layer and extend through the top dielectric etch stop layer to form a lower capacitor stack. The disclosed methodology may also form a top capacitor stack on the lower capacitor stack. To form the top capacitor stack, a first dielectric layer is formed on the multi-layer stack with a different material than the top dielectric etch stop layer; a second dielectric layer is formed on the first dielectric layer with a different material than the first dielectric layer; a second opening is selectively etched in the first and second dielectric layer to expose the cylinder-shaped second capacitor plate conductor using the top dielectric etch stop layer as an etch stop layer to protect the first capacitor plate conductor; a conductive plate layer is formed on the bottom and sidewall surfaces of the second opening; the second dielectric layer is removed to leave at least a portion of the conductive plate layer extending above the first dielectric layer; a second capacitor dielectric layer is formed to conformally coat exposed surfaces of the portion of the conductive plate layer extending above the first dielectric layer; and a plate electrode layer is formed on the second capacitor dielectric layer; where the portion of the conductive plate layer and second capacitor dielectric layer are surrounded by the plate electrode layer to form the top capacitor stack. Prior to forming the multi-layer stack, a contact pad may be formed in the planarized dielectric layer with the contact pad positioned for ohmic contact with the cylinder-shaped second capacitor plate conductor and to be isolated from the first capacitor plate conductor by at least a portion of the capacitor dielectric layer.

In yet another form, there is disclosed an integrated circuit DRAM circuit and associated method fabrication. The integrated circuit DRAM includes substrate in which is formed at least a portion of a dynamic random access memory (DRAM) bit cell circuit and a first conductive contact structure that is electrically connected thereto. The integrated circuit DRAM also includes a multilevel interconnect stack on the substrate which includes a top capacitor stack formed over a lower capacitor stack. As formed, the lower capacitor stack includes a first capacitor plate conductor formed in a multi-layer stack with a conductive layer that is sandwiched between a bottom and top dielectric layer, where an opening in the conductive layer defines a sidewall surface of the conductive layer. The lower capacitor stack also includes a capacitor dielectric layer located adjacent to the sidewall surface of the conductive layer. In addition, the lower capacitor stack includes a second capacitor plate conductor formed with a cylinder-shaped storage node electrode that is located adjacent to the capacitor dielectric layer so that the cylinder-shaped storage node electrode and capacitor dielectric layer are surrounded by and extend above the conductive layer and extend through the top dielectric. In selected embodiments, the integrated circuit DRAM circuit also includes a planar dielectric layer formed on the top dielectric layer with a different material than the top dielectric layer, where the cylinder-shaped storage node electrode extends through the top dielectric layer to protrude above the conductive layer, but does not extend through the planar dielectric layer. In selected embodiments, the top capacitor stack includes a second capacitor stack formed in a second multi-layer stack on the lower capacitor stack. In such embodiments, the top capacitor stack includes a third capacitor plate conductor formed with a second cylinder-shaped storage node electrode formed in the second multi-layer stack and directly electrically connected to the second capacitor plate conductor; a second capacitor dielectric layer surrounding the second cylinder-shaped storage node electrode; and a fourth capacitor plate conductor formed from a second conductive layer in the second multi-layer stack that is sandwiched between a bottom and top dielectric layer and directly electrically connected to the first capacitor plate conductor, where the second cylinder-shaped storage node electrode is surrounded by and extends through the second conductive layer. In other embodiments, the top capacitor stack includes a second capacitor stack formed in a second multi-layer stack on the lower capacitor stack. In such embodiments, the top capacitor stack includes a first capacitor plate conductor formed with one or more thin conductive extension structures that are directly electrically connected to the second capacitor plate conductor and are surrounded by a conformal capacitor dielectric layer, and a second capacitor plate conductor formed with one or more conductive layers that are directly electrically connected to the first capacitor plate conductor and that surround the first capacitor plate conductor and conformal capacitor dielectric layer.

Although the described exemplary embodiments disclosed herein are directed to various embedded capacitor structures and methods for making same, the present invention is not necessarily limited to the example embodiments which illustrate inventive aspects of the present invention that are applicable to a wide variety of fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, the lower capacitor stack is shown as being formed from the second metal (M2) level, but such capacitor stacks can be made from the first metal (M1) level or any desired metal level. And while the active circuit areas are illustrated with simplified transistor devices in an embedded DRAM circuit, this is merely for convenience of explanation and not intended to be limiting and persons of skill in the art will understand that the principles taught herein apply to other devices and circuits. Moreover, the thicknesses, depths, and other dimensions of the described layers and openings may deviate from the disclosed ranges or values. In addition, the terms of relative position used in the description and the claims, if any, are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A memory device having a semiconductor substrate that includes a substrate surface, the memory device comprising:
    a first conductive plate;
    a second conductive plate;
    a select transistor on the substrate surface, the select transistor including a source end and a drain end;
    a conducting line having a location thereon that makes electrical connection to the source end of the select transistor;
    a cylindrical storage element connected to the drain end of the select transistor, the cylindrical storage element including a cylindrical conductive element, the cylindrical conductive element penetrating through at least the first conductive plate and the second conductive plate;
    an insulating film including:
    a sidewall portion at least substantially perpendicular to the substrate surface and covering a side surface of the cylindrical conductive element; and
    a bottom portion at least substantially parallel to the substrate surface, and the insulating film intervening between the first conductive plate and the cylindrical conductive element, and the insulating film further intervening between the second conductive plate and the cylindrical conductive element; and
    a hole defined by the bottom portion of the insulating film, and the cylindrical conductive element penetrating through the hole and being electrically connected to the drain end of the select transistor.

2. The memory device of claim 1 further comprising an interlayer insulation layer, and
    wherein the second conductive plate is stacked over the first conductive plate and an interlayer insulation layer is intervening between the first and second conductive plates.

3. The memory device of claim 2 wherein the cylindrical conductive element includes at least a conformal conductive layer.

4. The memory device of claim 2 wherein the insulating film comprises silicon nitride.

5. The memory device of claim 2 wherein the cylindrical conductive element comprises polysilicon.

6. The memory device of claim 2 further comprising:
a first contact that intervenes between the cylindrical storage element and the semiconductor substrate, and
wherein a lateral diameter of a portion of the cylindrical storage element proximate to the first contact is smaller than a lateral diameter of a widest portion of the first contact.

7. The memory device of claim 6 further comprising a second contact that intervenes between the conducting line and the semiconductor substrate.

8. The memory device of claim 2 wherein the conducting line is located closer to the semiconductor substrate than the cylindrical storage element.

9. The memory device of claim 2 wherein the select transistor includes a channel, and at least a portion of the channel being located within the semiconductor substrate and extending in a direction horizontal to substrate surface.

10. The memory device of claim 1 further comprising active circuits forming part of the semiconductor substrate.

11. The memory device of claim 10 wherein the active circuits comprise volatile memory circuits.

12. The memory device of claim 1 wherein the cylindrical storage element is located at the M2 interconnect layer of the memory device.

13. The memory device of claim 1 wherein the cylindrical storage element is located at the M1 interconnect layer of the memory device.

14. A semiconductor device comprising:
a semiconductor substrate having an upper surface;
a select transistor having a gate electrode;
a first contact plug adjacent to the gate electrode and in direct contact with the semiconductor substrate, the first contact plug having a lower portion proximate to the semiconductor substrate and a pad portion on the lower portion, the pad portion being wider than the lower portion;
a conductive pillar on the contact plug, the conductive pillar having a substantially cylindrical shape and having a side surface and a bottom surface, the bottom surface being in direct contact with the contact plug;
an insulating film surrounding the side surface of the conductive pillar, the insulating film having a bottom portion in direct contact with the contact plug, the bottom portion surrounding the bottom surface of the conductive pillar;
first and second conductive layers being substantially plate-shaped, the first conductive layer surrounding a lower portion of the insulating film and the conductive pillar, and the second conductive layer surrounding an upper portion of the insulating film and the conductive pillar; and
an interlayer insulation layer intervening between the first and second conductive layers.

15. The semiconductor device of claim 14 further comprising a memory wherein the conductive pillar forms part of a storage element of the memory.

16. The semiconductor device of claim 14 wherein the conductive pillar includes at least a conformal conductive layer.

17. The semiconductor device of claim 14 wherein the insulating film comprises silicon nitride.

18. The semiconductor device of claim 14 wherein the conductive pillar comprises polysilicon.

* * * * *